United States Patent
Choi et al.

(10) Patent No.: US 6,392,916 B1
(45) Date of Patent: May 21, 2002

(54) CIRCUIT FOR PROVIDING AN ADJUSTABLE REFERENCE VOLTAGE FOR LONG-LIFE FERROELECTRIC RANDOM ACCESS MEMORY DEVICE

(75) Inventors: Mun-Kyu Choi; Byung-Gil Jeon, both of Kyunggi-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/675,559

(22) Filed: Sep. 29, 2000

(30) Foreign Application Priority Data

Oct. 1, 1999 (KR) .............................. 99-42355
Aug. 11, 2000 (KR) .............................. 00-46678

(51) Int. Cl.[7] .............................................. G11C 11/12
(52) U.S. Cl. ...................... 365/145; 365/65; 365/185.2; 365/185.23; 365/149
(58) Field of Search ..................... 365/189.01, 65, 365/145, 149, 185.2, 185.23

(56) References Cited

U.S. PATENT DOCUMENTS

| | | | | |
|---|---|---|---|---|
| 5,373,463 A | * | 12/1994 | Jones et al. ................. | 365/145 |
| 5,524,093 A | * | 6/1996 | Kuroda ........................ | 365/145 |
| 5,565,695 A | * | 10/1996 | Johnson ....................... | 257/295 |
| 5,654,566 A | * | 8/1997 | Johnson ....................... | 257/295 |
| 6,097,623 A | * | 8/2000 | Sakata et al. ................ | 365/145 |
| 6,128,213 A | * | 10/2000 | Kang .......................... | 365/145 |
| 6,236,605 B1 | * | 5/2001 | Mori et al. .................. | 365/205 |

* cited by examiner

Primary Examiner—Viet Q. Nguyen
(74) Attorney, Agent, or Firm—Marger Jonson & McCollom, P.C.

(57) ABSTRACT

A reference circuit, which is applied to a ferroelectric random access memory device, includes a polarization state detection circuit having dummy cells with ferroelectric capacitors. The detection circuit checks polarization states of the ferroelectric capacitor in the dummy cells using dumping voltages of different levels, and generates pass/fail signals as a check result. The generated pass/fail signals are decoded, using themselves as selection information for selecting one of reference voltages, of different levels, which are generated from a reference voltage generation circuit. Thus, it is possible to generate an optimal reference voltage, which senses a ferroelectric capacitor polarization state that is changed with time.

17 Claims, 16 Drawing Sheets

CIRCUIT FOR PROVIDING AN ADJUSTABLE REFERENCE VOLTAGE FOR LONG-LIFE FERROELECTRIC RANDOM ACCESS MEMORY DEVICE

This application relies for priority upon Korean Patent Application No. 1999-42355, filed on Oct. 1, 1999 and No. 2000-46678, filed on Aug. 11, 2000, the contents of which are herein incorporated by reference in their entirety.

1. Field of the Invention

The present invention relates to ferroelectric random access memory devices and, more particularly, to a reference voltage generation circuit for ferroelectric random access memory devices.

2. Background of the Invention

A ferroelectric random access memory (hereafter referred to as "FRAM" uses a ferroelectric capacitor as a storage element of each memory cell. Each ferroelectric memory cell stores a logic state based upon electric polarization of its ferroelectric capacitor. A ferroelectric capacitor has dielectric material including ferroelectric material such as PZT($PbZrTiO_3$; lead-zirconate-titanate) between its two electrode plates. When a voltage is applied to both plates of a ferroelectric capacitor, ferroelectric material is polarized toward an electric field. A switching threshold voltage for changing polarization state of a ferroelectric capacitor is called a "coercive voltage"

A ferroelectric capacitor exhibits a hysteresis characteristic, and through which current corresponding to its polarization state flows, If a ferroelectric capacitor is biased with an applied voltage higher than its coercive voltage, the capacitor will change its polarization state according to polarity of the applied voltage. The polarization state is maintained even after power down, which makes the memory cell non-volatile.

Polarization states of ferroelectric capacitor can be changed in less time than about 1 nanosecond, which its faster than the programming time of other non-volatile memories, such as flash EEPROMs (electrically erasable programmable read only memories).

Data stored in a ferroelectric memory cell is read out as follows. A voltage is applied to both electrodes of a ferroelectric memory cell capacitor, and then a variation of charges induced on a bit line coupled to the memory cell is sensed. In order to sense the variation of the induced charges(i.e., voltages), a circuit is needed that generates a reference voltage having a voltage value that is intermediate to voltages corresponding to data"1" and data"0". Conventionally, the reference voltage is generated by use of a reference cell that includes a ferroelectric capacitor having characteristics similar to that of a memory cell.

A perplexing problem in sensing the polarization state of the ferroelectric capacitor in a single capacitor memory cell is that the electric field/polarization characteristic loop (hysteresis curve) of a ferroelectric capacitor changes over time. The change is due to aging from use, or due to aging from being left in a polarization state for an extended time. Generally, this change in polarization properties with time results in a collapsing of the hysteresis curve. This is a basic materials phenomenon that is due to a non-reversibility in at least a portion of the volume of the ferroelectric material under electric field/polarization cycling. This changing of the ferroelectric material makes it very difficult to use a conventional reference cell strategy to determine the polarization state Of ferroelectric memory cells.

A variety of techniques have been suggested to overcome such problems. One solution is described in U.S. Pat. No. 5,432,731, entitled "FERROELECTRIC MEMORY CELL AND METHOD OF SENSING AND WRITING THE POLARIZATION STATE THEREOF" issued to Howard C. Kirsch et al., on Jul. 11, 1995. The Kirsch et al. patent described one capacitor ferroelectric memory cell having a reference cell, as reproduced in FIG. 1 of the present document.

Referring to FIG. 1, a simplified one-capacitor ferroelectric memory cell 10 with an associated reference cell 12 is illustrated. Memory cell 10 includes a single switching transistor 15 and a ferroelectric capacitor 20. Generally, to form an array of memory cells, additional memory cells are provided in a first horizontal row that includes memory cell 10. The first row containing memory cell 10 has a WORD line 22 and a PLATE line 23 associated therewith. Additional horizontal rows (not shown) parallel therewith and each including a WORD line and a plate line are provided. Also, memory cell 10 is arranged in a first vertical column with additional memory cells (not shown) having a common BIT line pair 24, 25 connected to a sense amplifier, or latch, 30. Additional columns, each having common BIT line pairs and sense amplifiers are also provided in the array. BIT line 24 is connected to memory cell 10, and to all other memory cells in the first column while BIT line 25 is connected to reference cell 12.

WORD line 22 is connected to the gate of switching transistor 15, and to the gate of switching transistors in each other memory cell in the first row. PLATE line 23, is connected to one plate of ferroelectric capacitor 20, the other plate of which is connected to the drain of switching transistor 15. PLATE line 23 is similarly connected to other memory cells in the first row. The source of switching transistor 15 is connected to BIT line 24 and the sources of switching transistors in all other memory cells in the first column are connected to BIT line 24.

Reference cell 12 is associated with all of the memory cells in the first column. As such, a single reference cell can be used with any memory cell, which allows the use of a single reference cell with each column. Referring to FIG. 1 of the present document, a reference cell 12 has a voltage dumping structure where a reference voltage is supplied onto a bitline BITC. The reference cell 12 includes a first switching transistor 35, a second switching transistor 37, and a reference capacitor 39. A gate of the first switching transistor 35 is connected to an REF WORD line 40, and a source of which is connected to BITC line 25.

One plate of the reference capacitor 39 is connected to a ground, and the other plate is connected to a drain of the first switching transistor 35 and to a source of the second switching transistor 37. A drain of the second switching transistor 37 is connected to a reference potential REF INIT, and a gate of which is connected to receive a reference initial signal, Using the voltage dumping structure, a reference voltage of DC level is generated to solve the foregoing problem that occurs upon using a reference cell having a ferroelectric capacitor. However, a memory cell is afflicted with a phenomenon that a hysteresis loop of a ferroelectric capacitor changes with time.

Referring to FIG. 2A, a polarization state of a ferroelectric capacitor changes according to an initially ideal curve (indicated by a solid line). And, the ferroelectric capacitor will change according to a deteriorated or collapsing hysteresis curve (indicated by a dotted line) in a predetermined time.

As can be seen in FIG. 2B, a polarization level of a ferroelectric capacitor storing data "1" is reduced from point C to point 'C'. On the other hand, the polarization level of a ferroelectric capacitor storing data"0" is increased from point A to point 'A'.

Referring to FIG. 2B, which illustrates changes of voltages induced on a bitline with respect to time as the device ages, there is a difference between a reduction ratio of a bitline voltage corresponding to date"1" (curve D1) and that of a bitline voltage corresponding to date"0" (curve D0). So an optimal sensing margin cannot be secured in a predetermined time.

More particularly, here, the optimal sensing margin means that a sensing margin MD1 between a bitline voltage corresponding to date"1" and a reference voltage VREF and a sensing margin MD2 between a bitline voltage corresponding to data"0" and the reference voltage VREF are greater the or identical to required margin. For example, if the sensing margin MD1 is smaller than a required margin and the sensing margin MD0 is greater than the required margin at a time t1, sensing operation of the data MD1 cannot be carried out.

When a hysteresis curve collapses as shown in FIG. 2A, a reference voltage VREF having an intermediate value of bitline voltages of data"0" and data"1" cannot be generated using the reference circuit shown in FIG. 1. This means that life of an FRAM device becomes short, or its reliability is degraded.

SUMMARY OF THE INVENTION

The invention overcomes this problem of the prior art.

The invention provides a method and a circuit for generating a query reference voltage for querying an operation cell of a ferroelectric random access memory device for its data. The querying reference voltage has a value that is adjusted with time, to remain between the actual values of the operation cell, notwithstanding degradation of hysteresis due the age and use of the operation cell.

A circuit according to the invention comprises evaluating means for evaluating performance characteristics of ferroelectric cells of the memory device. It also includes generating means for generating a query reference voltage depending on an output of the evaluating means.

The evaluation is preferably performed by interrogating the cells, in order to obtain respective sample characteristics. The sample characteristics are then preferably polled to determine the performance characteristics.

Optionally and preferably, the invention provides additional dummy cells, distinct from the normal operation cells of the device. The dummy cells are dedicated for the evaluation, and ultimately for the generation of the adjustable reference voltage.

These and other features and advantages of the invention will be more clearly understood from the Detailed Description and the Drawing, in which:

DESCRIPTION OF THE PREFERRED EMBODIMENT

A new and improved reference circuit of this invention is used in a ferroelectric random access memory (FRAM) device. The reference circuit reflects change in a polarization state of a ferroelectric capacitor with time to a reference voltage. That is, the reference voltage is changed by sensing change of a polarization state. Therefore, the reference circuit is changed according to change of the polarization state, and is able to obtain a reference voltage having an intermediate value of voltages corresponding to data"0" and data"1". As a result, it is possible to lengthen life of the FRAM device and improve reliability thereof.

Figure 3:
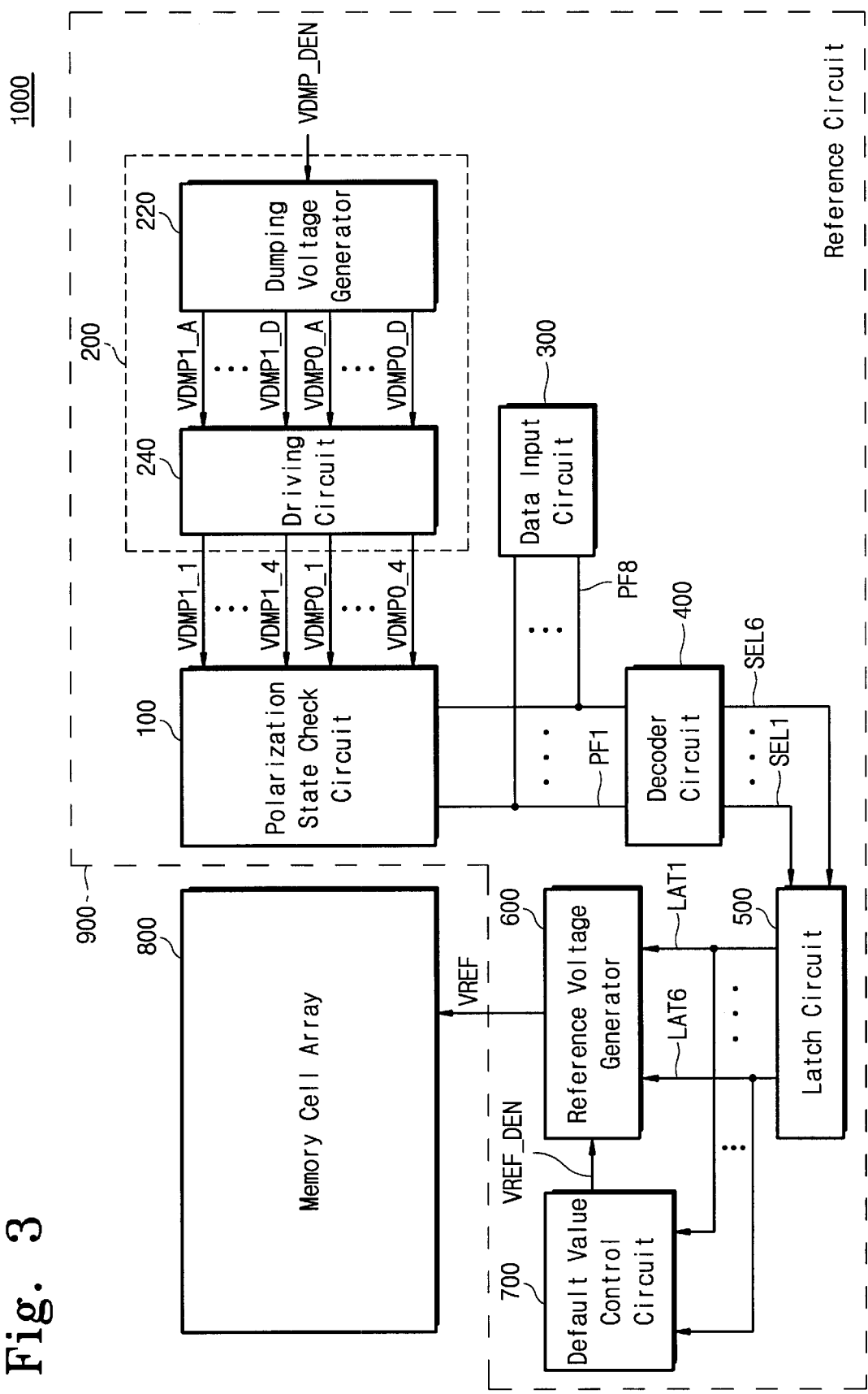
FIG. 3 is a block diagram showing a ferroelectric random access memory device in accordance with the present invention.

Referring now to FIG. 3, an FRAM device 1000 includes a memory cell array 800 and a reference circuit 900. Data information is stored in the memory cell array 800 which includes memory cells (not shown) and sense amplifiers (not shown). Each of the memory cells has a ferroelectric capacitor, and the sense amplifiers sense data of each of the memory cells. The reference circuit 900 automatically tracks change in a polarization state of a ferroelectric capacitor with time, and then supplies a reference voltage VREF varied according to the tracked change to the memory cell array 800. The reference circuit 900 is composed of a polarization state detection circuit 100, a dumping voltage supply circuit 200, a data input circuit 300, a decoder circuit 400, a latch circuit 500, a reference voltage generator 600, and a default value control circuit 700.

Now, circuit architecture and operation of each block 100~700 in the reference circuit 900 will be described more fully hereinafter with reference to FIG. 4 to FIG. 11.

Figure 4:
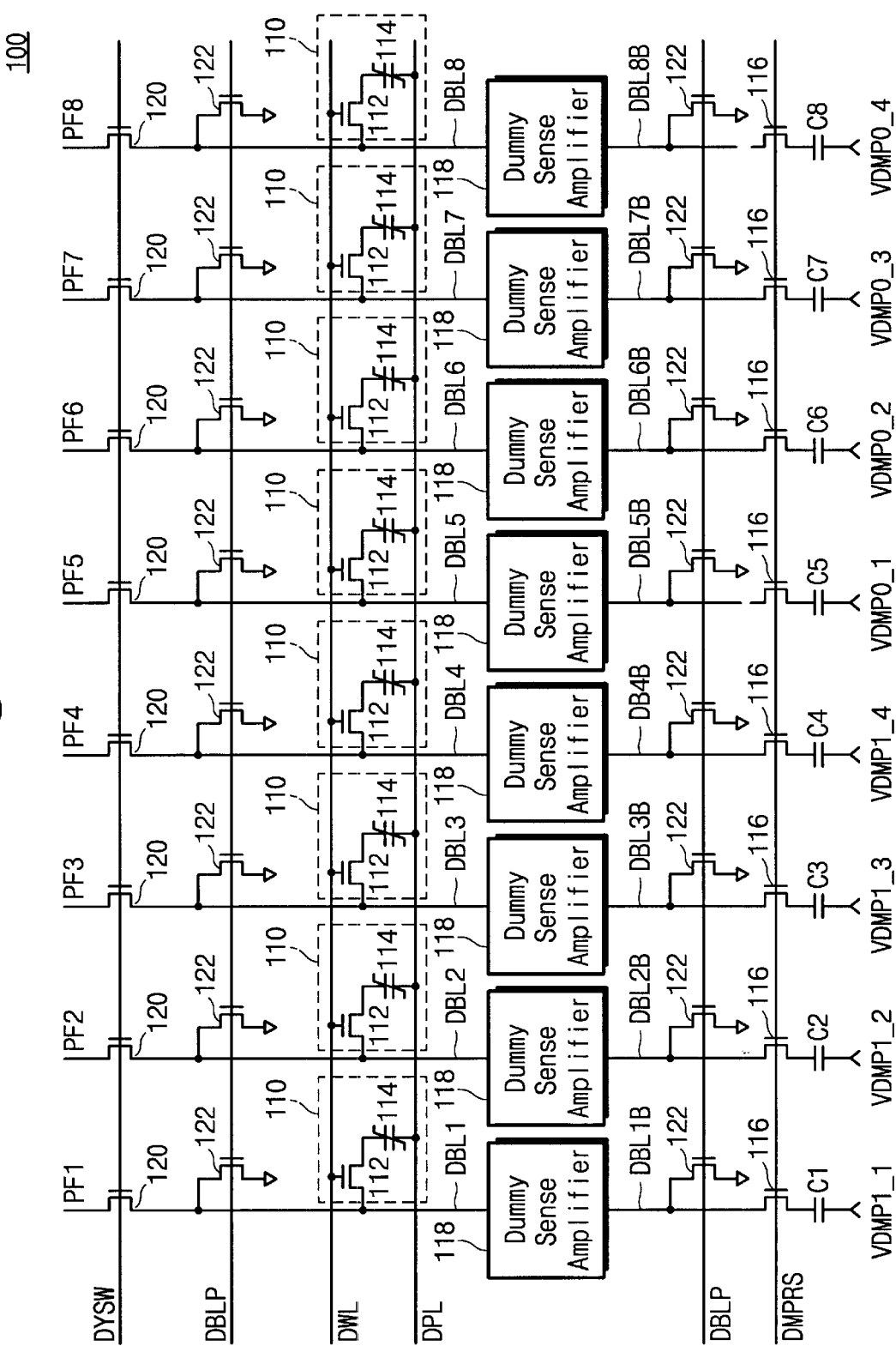
FIG. 4 illustrates a preferred embodiment of a polarization state detection circuit shown in FIG. 3.

Referring now to FIG. 4, a polarization state detection circuit 100 includes a plurality of dummy cells 110, dummy sense amplifiers 118 corresponding to the dummy cells, respectively, first dummy bitlines DBLj (j=1~8), and second dummy bitlines DBLjB. Each of the dummy cells is composed of an access transistor 112 and a ferroelectric capacitor 114. Fabricating each of the capacitors is substantially identical to fabricating ferroelectric capacitors supplied to a memory cell array 800. One plate electrodes of the ferroelectric capacitors 114 are connected to corresponding to first dummy bitlines DBL1~DBL8 via current paths of corresponding access transistors 112, respectively. The other plate electrodes are commonly connected to a dummy plate line DPL. Gates of the access transistors 112 are commonly connected to a dummy word line DWL.

A half of the dummy cells 110, e.g., dummy cells 110 coupled to the first dummy bitlines DBL1~DBL4 store first-logic-state data (e.g., data"1"), respectively. The other cells 110, e.g., dummy cells coupled to the first dummy bitlines DBL5~DBL8 store second-logic-state data (e.g., data"2"), respectively.

Referring to FIG. 4 again, the polarization state detection circuit 100 further includes capacitors C1~C8 that correspond to the second dummy bitlines DBL1B~DBL8B, respectively. One plate electrodes of the capacitors C1~C8 are connected to dumping voltages VDMP1_1~VDMP1_4 and VDMP0_1~VDMP0_4 supplied from the dumping voltage supply circuit 200, respectively. The other plate electrodes are connected to corresponding second dummy bitlines DBL1B~DBL8B via corresponding NMOS transistors 116, respectively. The NMOS transistors 116 are simultaneously turned on/off according to a logic state of a switch control signal DMPRS.

The dummy sense amplifiers 118 are coupled between the first dummy bitlines DBL1~DBL8 and the second dummy bitlines DBL1B~DBL8B, respectively. The dummy sense amplifier 118 senses a voltage difference between corresponding first and second dummy bitlines. According to sensing result, the dummy sense amplifier 118 then amplifies a voltage of a corresponding first dummy bitline to a first logic state (e.g., power supply voltage) or a second logic state (e.g., ground voltage) and amplifies a voltage of a corresponding second dummy bitline to a second logic state or a first logic state, respectively. That is, corresponding first and second dummy bitlines are set to opposite logic states by a corresponding sense amplifier. Logic states of first dummy bitlines, sensed and amplified by the dummy sense amplifiers 118, are used as pass/fail signals PF1~PF8 which correspond to the dummy cells, respectively.

The first dummy bitlines DBL1~DBL8 are connected to a decoder circuit 400 (see FIG. 3) via NMOS transistors 120, which are simultaneously turned on/off according to a logic state of a switch control signal DYSW. The first and second dummy bitlines DBL1~DBL8 and DBL1B~DBL8B are precharged to a ground voltage via corresponding NMOS transistors (or bitline precharge transistors). The NMOS transistors 122 are simultaneously turned on when a precharge signal DBLP is at a logic high level, and composes a precharge circuit.

The polarization state detection circuit 100 checks each polarization state of the ferroelectric capacitors 114 in response to a plurality of dumping voltages VDMP1_1~VDMP1_4 and VDMP0_1~VDMP0_4 supplied from a dumping voltage supply circuit 200. As a check result, the circuit 100 generates pass/fail signals PFj (j=1~8) which correspond to the dummy cells 110, respectively. The dumping voltages VDMP1_1~VDMP1_4 and VDMP0_1~VDMP0_4 have voltage levels which are different from each other, and correspond to the dummy cells, respectively. Thus, the pass/fail signals PF1~PF8 indicate whether voltages corresponding to polarization states of corresponding ferroelectric capacitors (voltages induced by corresponding bitlines, respectively) are higher than corresponding dumping voltages.

For example, when a bitline induction voltage corresponding to a polarization state of a ferroelectric capacitor corresponding to a dummy bitline DBL1 is higher than a corresponding dumping voltage, a corresponding pass/fail signal PF1 has a high level (i.e., "1"). When is lower than a corresponding dumping voltage, a corresponding pass/fail signal PF1 has a low level (i.e.,"0"). When a bitline induction voltage corresponding to a polarization state of a ferroelectric capacitor corresponding to a dummmy bitline DBL5 is higher than a corresponding dumping voltage, a corresponding pass/fail signal PF5 has a high level (i.e.,"1"). When is lower than a corresponding dumping voltage, a corresponding pass/fail signal PF5 has a low level (i.e.,"0"). Namely, when voltages induced to dummy bitlines DBL1~DBL4 are higher than corresponding dumping voltages, all the signals PF1~PF4 have"1" indicating a pass state. When are lower than corresponding dumping voltages, all the signals PF5~PF8 have"0" indicating a pass state.

Referring to FIG. 3 again, a dumping voltage supply circuit 200 is composed of a dumping voltage generator 220 and a driving circuit 240. A preferred embodiment of the generator 220 and a preferred embodiment of the circuit 240 are illustrated in FIG. 5 and FIG. 6, respectively.

Figure 5:
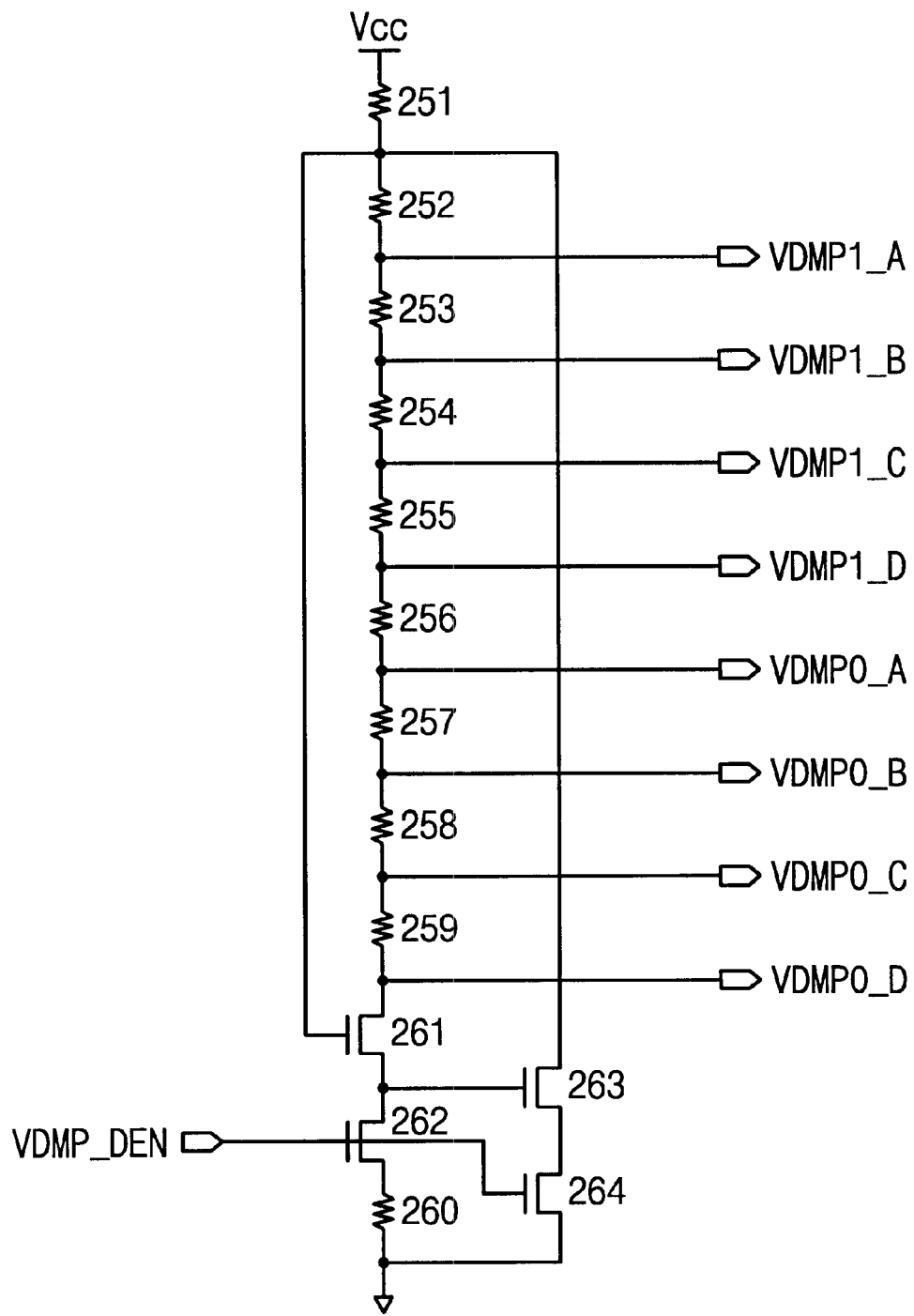
FIG. 5 illustrates a preferred embodiment of a dumping voltage generator shown in FIG. 3.

In FIG. 5, a dumping voltage generator 220 is a voltage distributor using a plurality of resisters 251~560 and NMOS transistors 261 and 264. The distributor is understood by those skilled in the art. A signal VDMP_DEN is used for preventing power loss that may occur in the dumping voltage generator 200 after a reference signal 900 generates a suitable reference voltage VREF.

Figure 6:
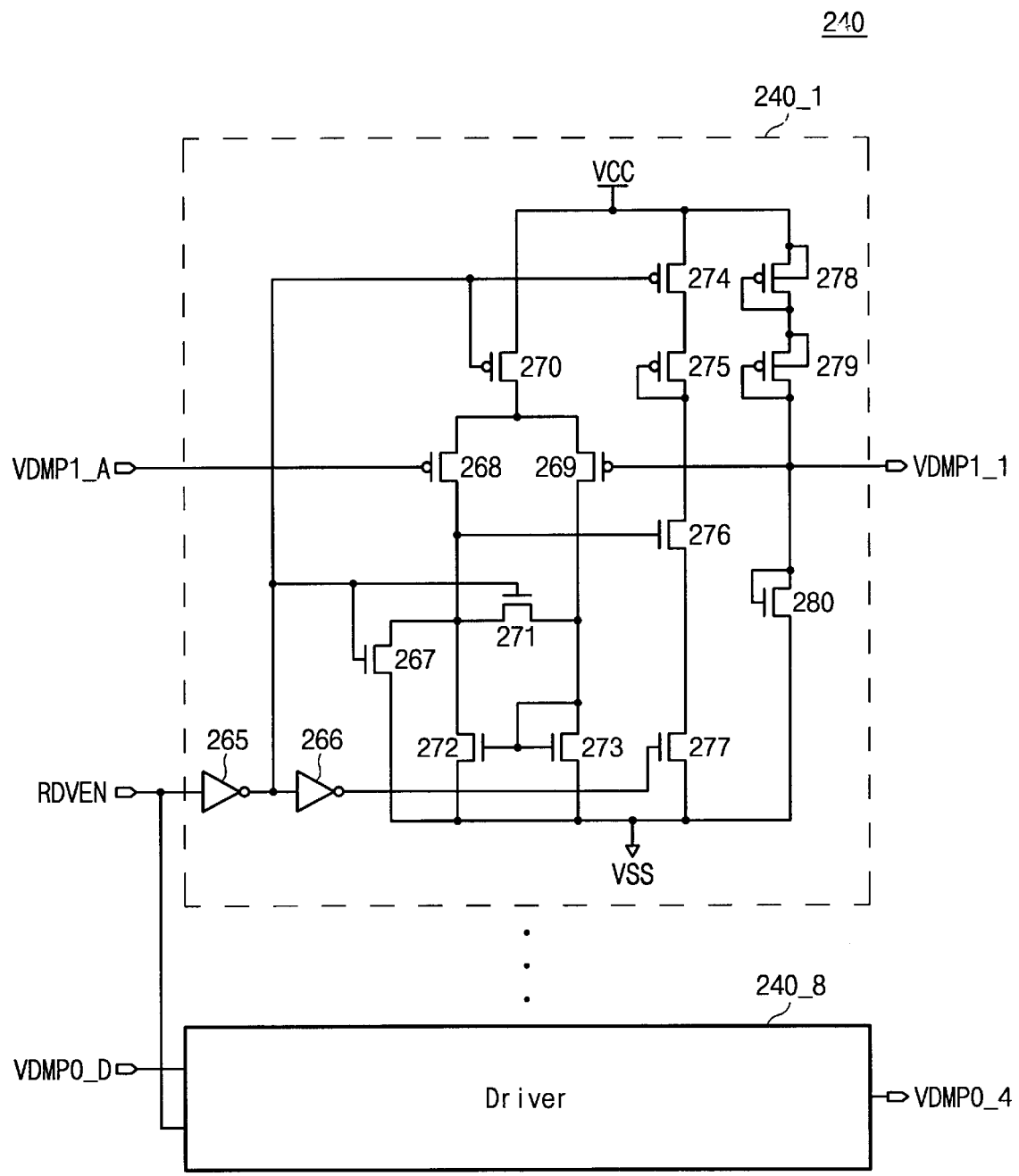
FIG. 6 illustrates a preferred embodiment of a driver circuit shown in FIG. 3.

In FIG. 6, a driving circuit 240 is used for transferring dumping voltages VDMP1_A~VDMP1_D and VDMP0A~VDMP0_D generated in a dumping voltage generator 220 to a polarization state detection circuit 100. The driving circuit 240 is composed of a plurality of drivers 240_1~240_8 which correspond to the dumping voltages VDMP1_A~VDMP1_D and VDMP0_A~VDMP0_D, respectively. The drivers 240_1~240_8 are commonly enabled or disabled by a signal RDVEN. Although a detailed circuit diagram of a driver 240_1 to only one dumping voltage VDMP1_A is shown in this drawing, drivers 240_2~240_8 corresponding to other dumping voltages shall identically be configured. The driving circuit 240 is used to reduce burden (e.g., signal line loading for transferring a dumping voltage) of a dumping voltage generator 220 coupled to the polarization state detection circuit. The drivers 240_1~240_8 output stable dumping voltages of which a voltage level is substantially identical to that of voltages supplied from the dumping voltage generator 220, respectively.

Figure 7:
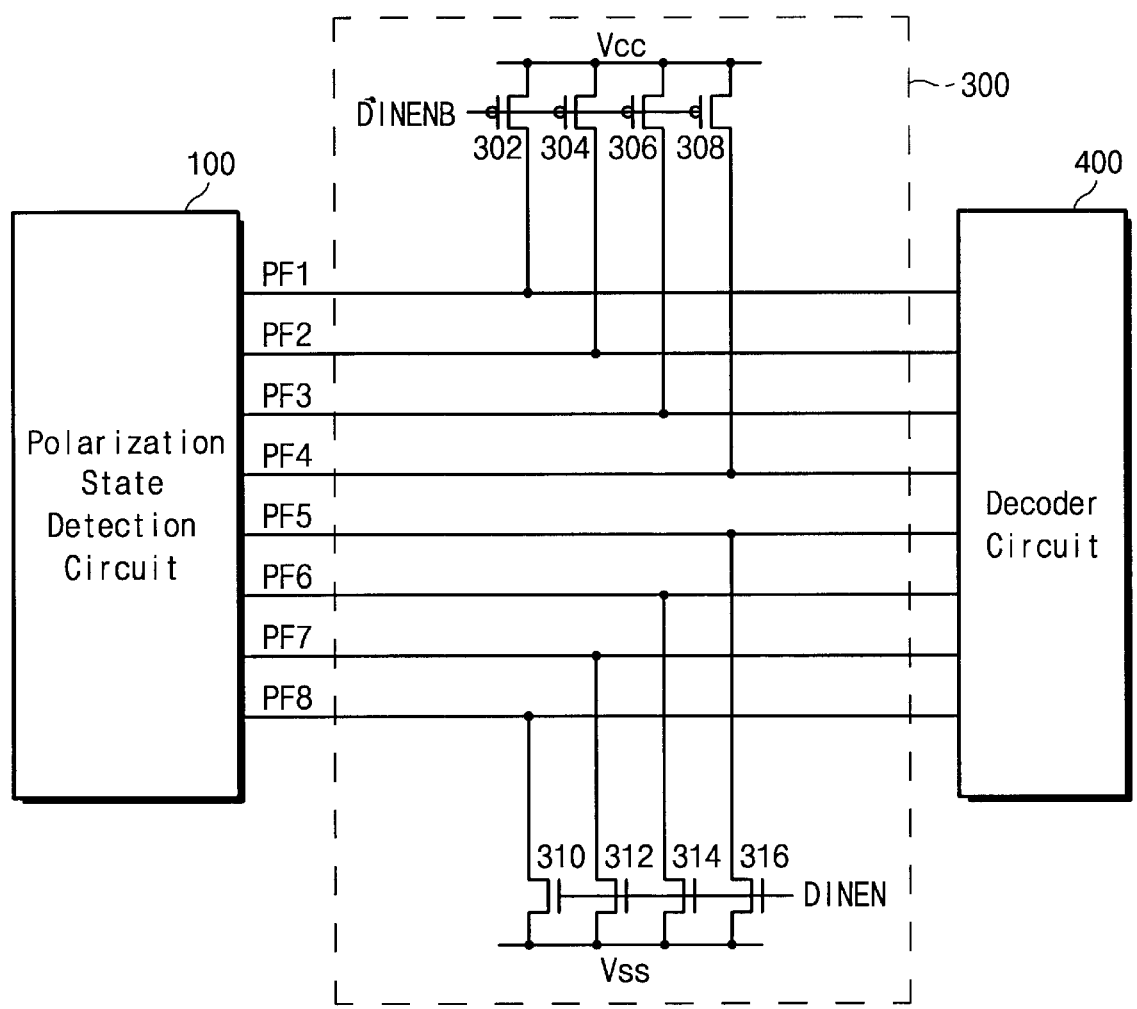
FIG. 7 illustrates a preferred embodiment of a data input circuit shown in FIG. 3.

Referring now to FIG. 7, a data input circuit 300 supplies data"1" and data"0" which will be used in dummy cells 110 supplied to the polarization state detection circuit 100 in power-up. The circuit 300 is composed of PMOS transistors 302, 304, 306, and 308 and NMOS transistors 310, 312, 314, and 316. The NMOS transistors 310, 312, 314, and 316 are simultaneously turned on/off according to a logic state of a signal DINEN. The PMOS transistors 302, 304, 306, and 308 are simultaneously turned on/off according to a logic state of a signal DINENB. The signal DINEN is enabled during write operation, which will be carried out in power-up, of the dummy cells 10. The write operation will be described more fully in later. When power is supplied to an FRAM device in which a reference circuit 900 is realized, data"1" is written via a data input circuit 300 in a half of the dummy cells 110 supplied to the polarization state detection circuit 100. In the others, data"0" is written via the data input circuit 300. This will be described more fully in later.

Figure 8:
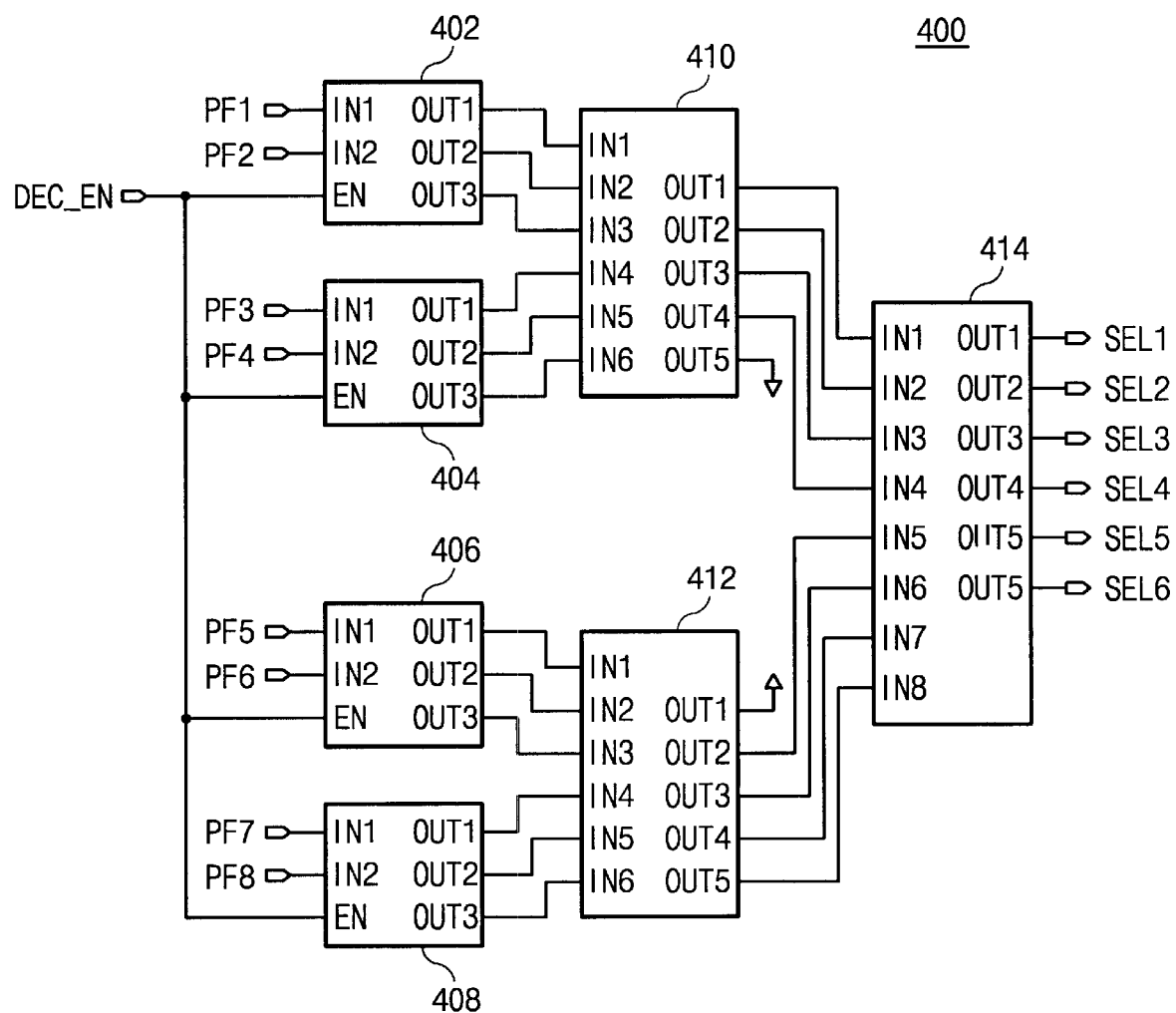
FIG. 8 is a block diagram showing a decoder circuit shown in FIG. 3.
Figure 9A:
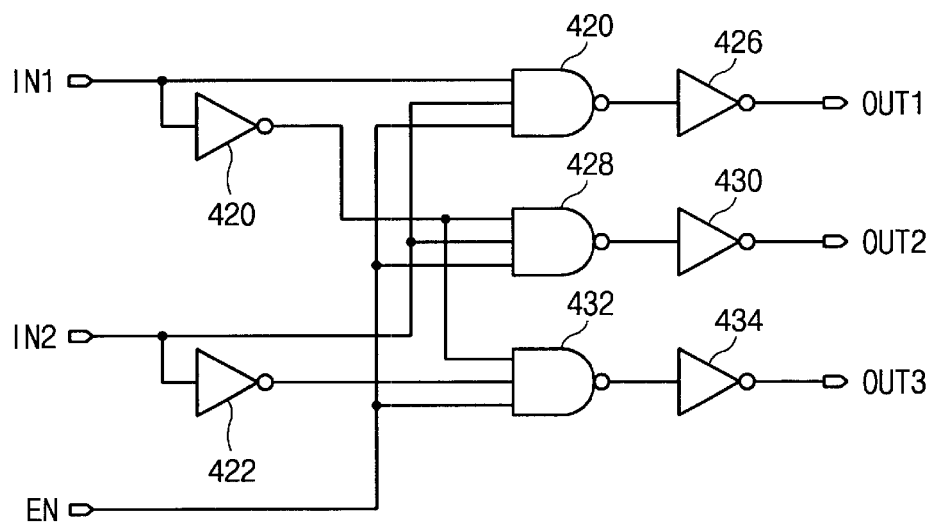
FIGS. 9A–9C illustrate preferred embodiments of each decoder in a decoder circuit shown in FIG. 8.
Figure 9B:
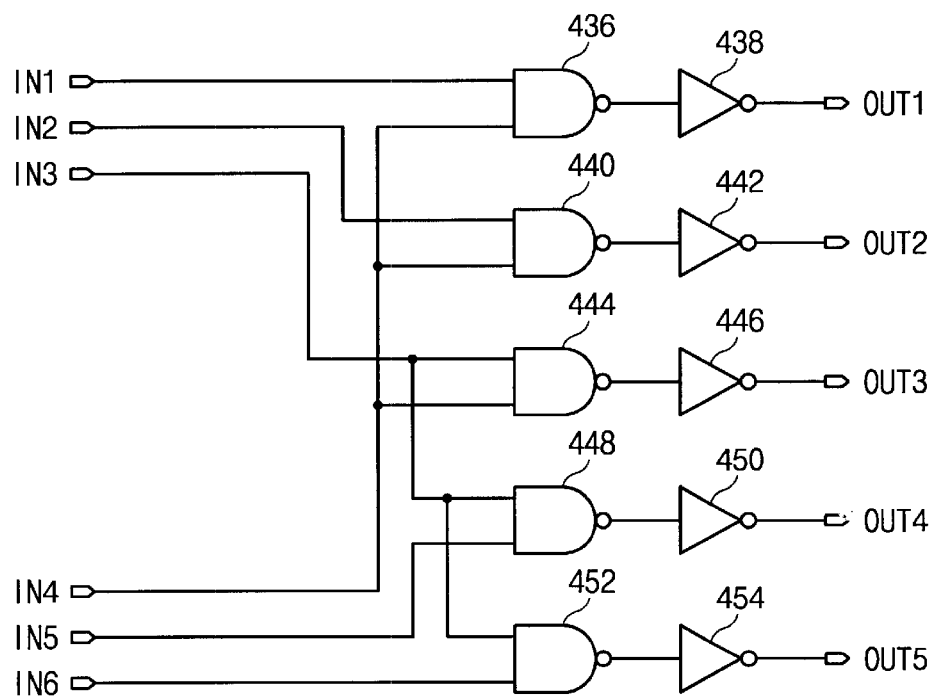
Figure 9C:
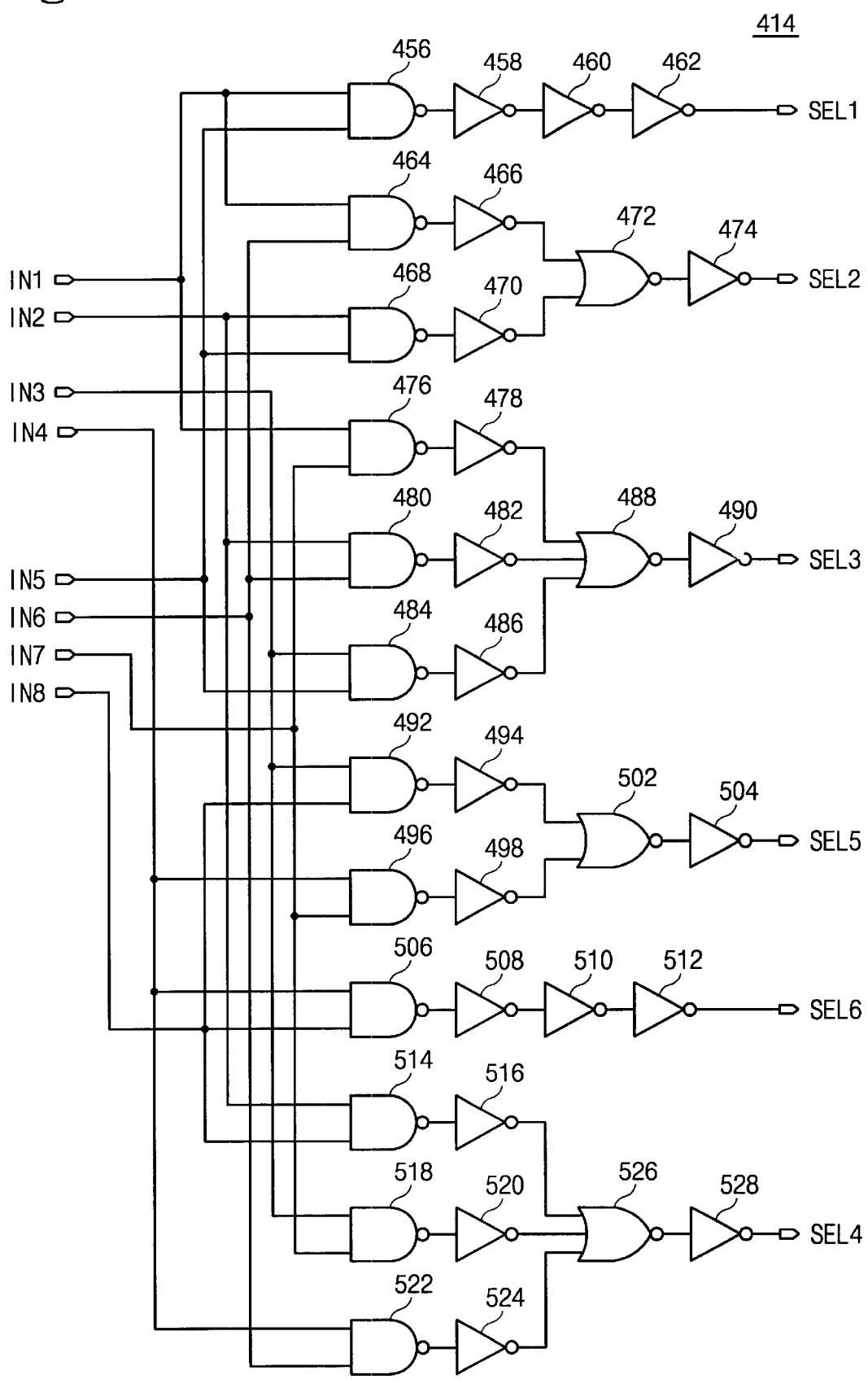

Referring now to FIG. 8, a decoder circuit 400 decodes pass/fail signals PF1~PF8 outputted from a polarization state detection circuit 100, generating selection signals SEL1~SEL6 for selecting an optimal reference voltage according to change in a polarization state of a ferroelectric capacitor. The decoder circuit 400 is composed of seven decoders 402~414 such that it has a triple decoding structure. A detailed circuit diagram of each of the decoders 402~414 is shown in FIGS. 9A–9C. In this structure, when a signal DEC_EN retains low level, the output signals SEL1~SEL8 of the decoder circuit 400 retain a disable state of low level.

When all the signals PF1~PF8 are associated with a pass state ("11110000") or fail state ("00001111"), all the output signals of the decoder circuit 400 retain a disable state of low level. The latch signal 500 holds the selection signals SEL1~SEL6. When the output signals PF1~PF8 have abnormal values owing to particles during fabrication process, all the output signals SEL1~SEL6 retain a disable state of low level. For example, when the output signals PF1~PF4 have "1011", "1101", and "1110", all the output signals SEL1~SEL6 retain a disable state of low level. Similarly, when the output signals PF5~PF8 have "1000", "0100", and "0010", all the output signals SEL1~SEL6 retain a disable state of low level.

In the above-mentioned cases, a reference voltage VREF of a default value is outputted from a reference voltage generator 600. Except the cases, one of the output signals SEL1~SEL6 is enabled to high level such that the reference voltage VREF, which is higher or lower than the default value, is outputted from the reference voltage generator 600. This will be described more fully in later.

Figure 10:
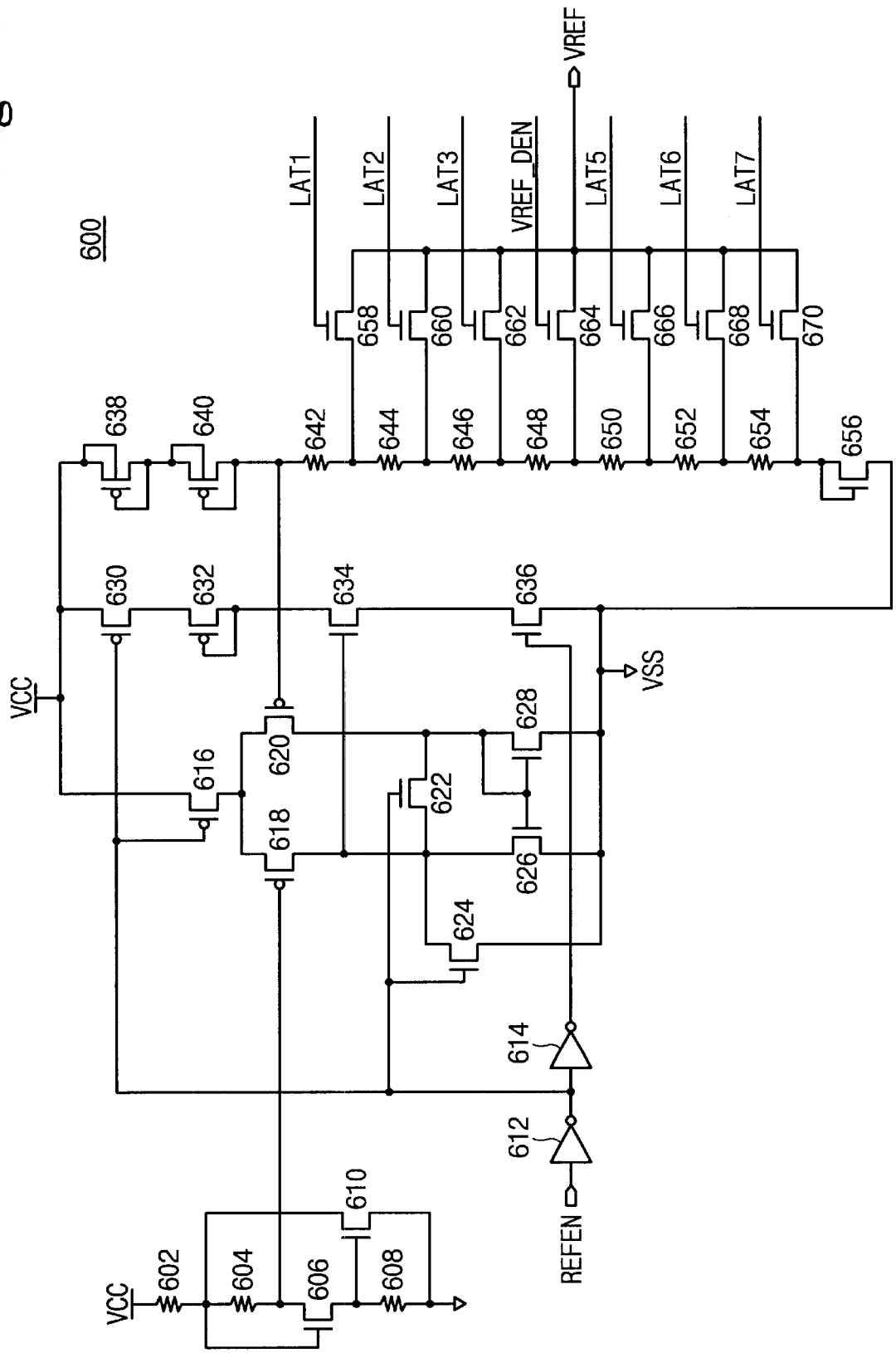
FIG. 10 illustrates a preferred embodiment of a reference voltage generator shown in FIG. 3.
Figure 11:
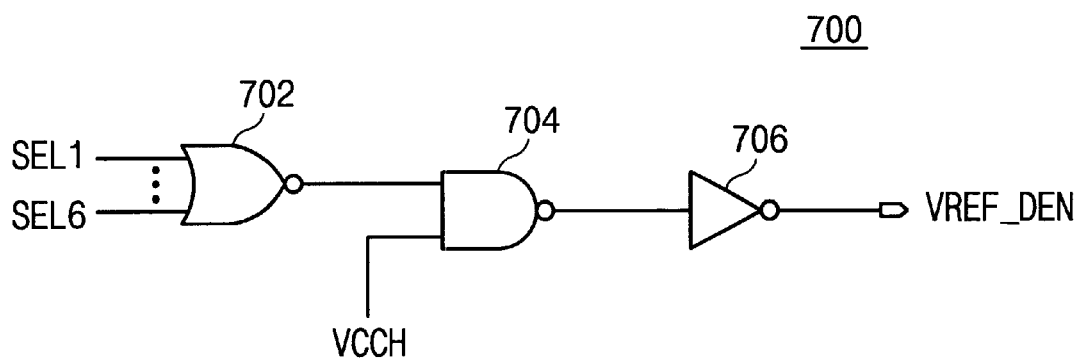
FIG. 11 illustrates a preferred embodiment of a default value control circuit shown in FIG. 3.

Referring now to FIG. 10, a reference voltage generator 600 is enabled by a signal REFEN. And, the generator 600 outputs a reference voltage VREF in response to output signals LAT1~LAT6 of a latch circuit and an output signal VREF_DEN of a default value control circuit 700. With reference to FIG. 11 showing a default value control circuit 700, the signal VREF_DEN has high level while power is supplied and all output signals LAT1~LAT6 of the latch circuit 500 retain low level. On the other hand, when one of the output signals LAT1~LAT6 goes to high level, the signal VREF_DEN goes to low level. In FIG. 11, a signal VCCH retains high level when power is supplied and the power is higher than a constant level.

After power is supplied, the output terminal VREF of the reference voltage generator 600 is charged with a predetermined voltage (hereafter, referred to as "default voltage") via an NMOS transistor 664 that is turned on by the signal VREF_DEN. As mentioned above, all the output signals SEL1~EL6 of the decoder circuit 400 then retain low level when all the pass/fail signals PF1~PF8 have pass states or fail states and have abnormal values owing to particles created in fabrication process. This enables the output signals LAT1~LAT6 of the latch circuit 500 to turn off the NMOS transistors 658, 660, 662, 666, 668, and 670 shown in FIG. 10. On the other hand, when one of the output signals SEL1~SEL6 goes to high level, an output signal VREF_DEN of the default value control circuit 700 goes to low level. This enables the reference voltage generator 600 to generate a reference voltage which is higher or lower than a default voltage in voltage level.

Figure 12A:
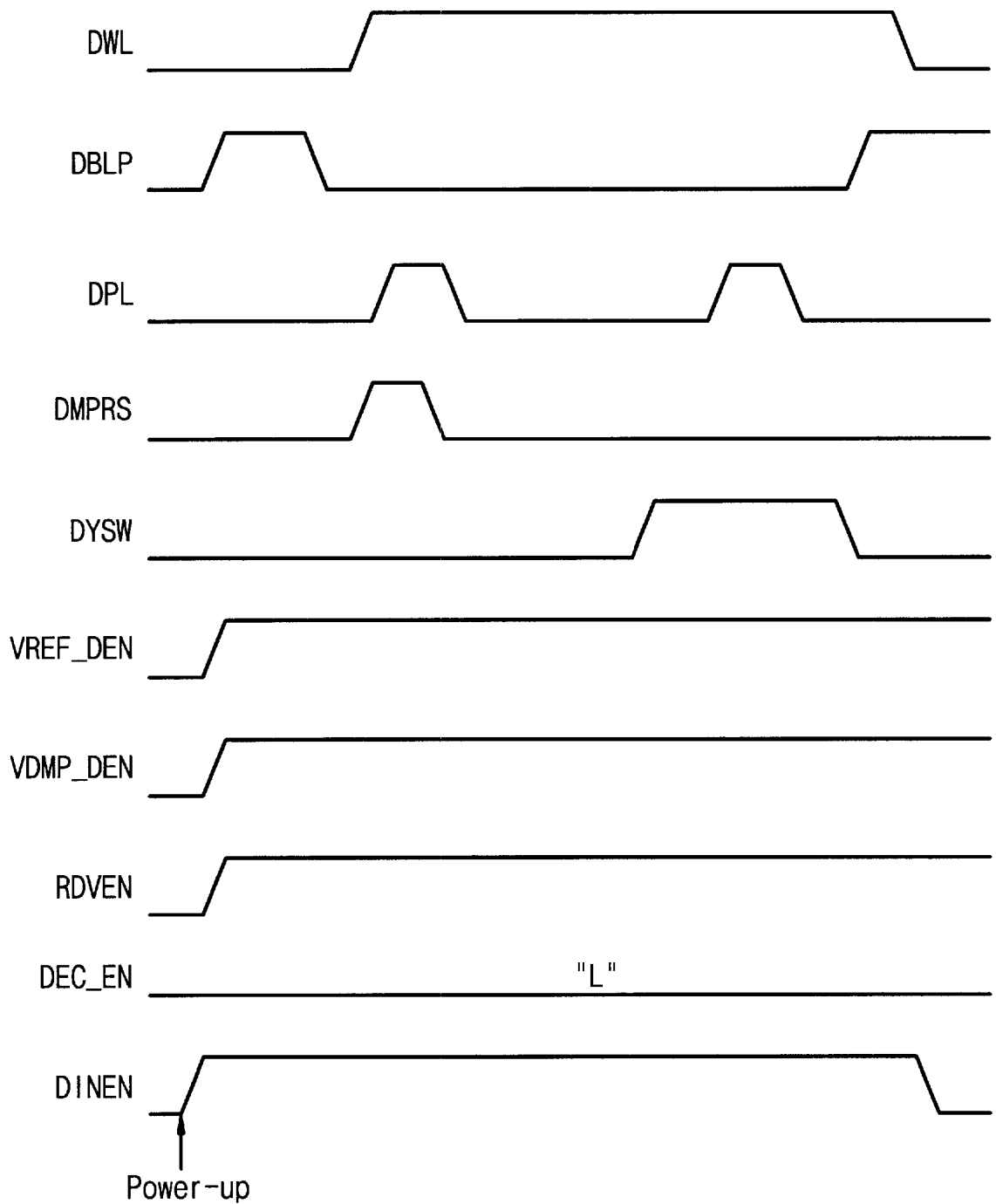
FIGS. 12A and 12B are timing views for describing operation of a polarization state detection circuit of the invention.
Figure 12B:
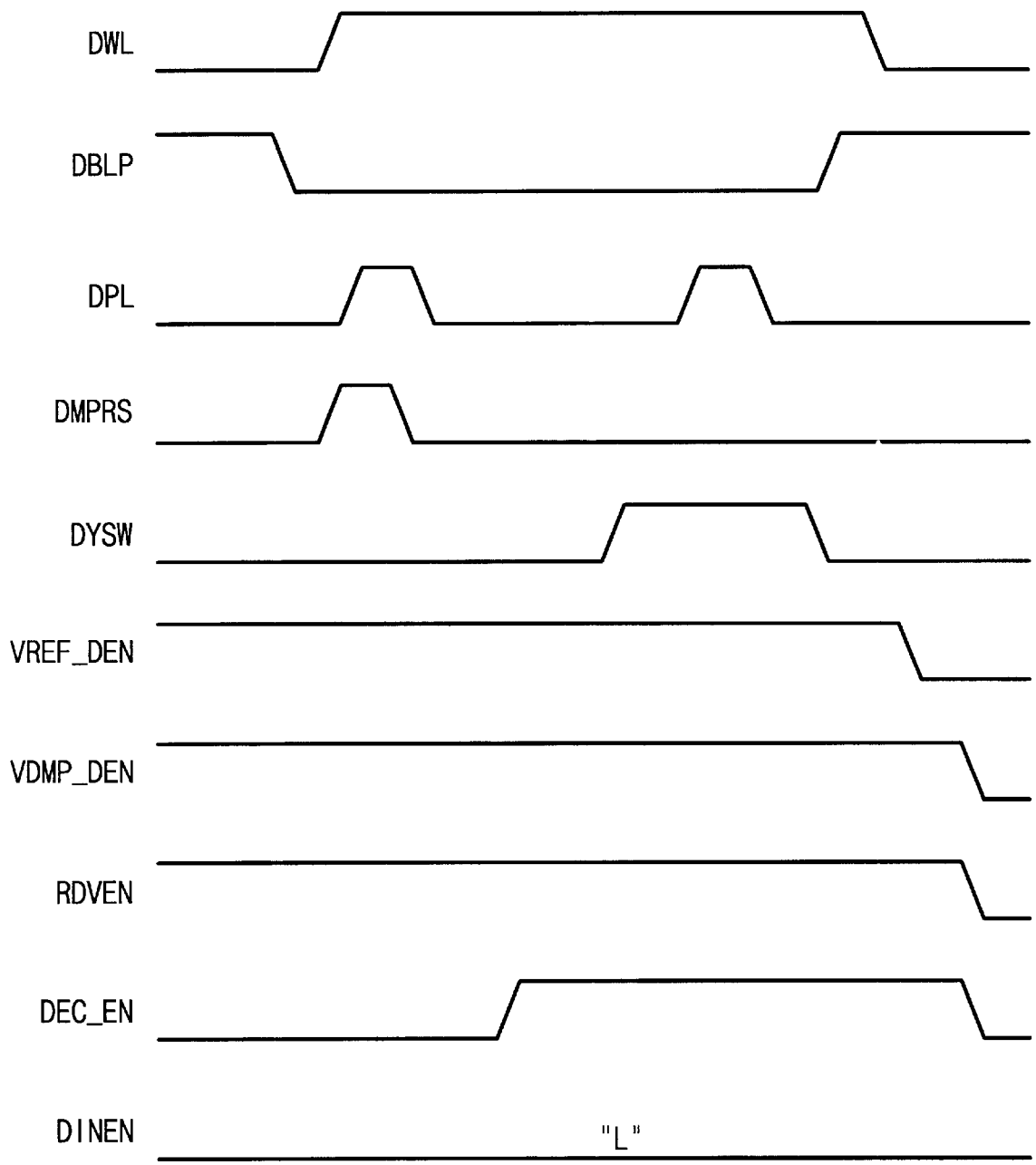

As mentioned above, when power is supplied to an FRAM device in which a reference voltage 1000 is realized, data "1" is written in a half of the dummy cells 110 supplied to the polarization state detection circuit 100 via the data input circuit 300. And, data "1" is written in the others via the data input circuit 300. After data is written in the polarization state detection circuit 100, read operation is performed for checking polarization states of dummy cells supplied to the polarization state detection circuit 100. This is described more fully below, with reference to FIGS. 12A and 12B, which show timing views for explaining write and read operations of the polarization state detection circuit 100.

In operation for writing data in dummy cells of a polarization state detection circuit 100, all control signals DINEN, VREF_DEN, VDMP_DEN, and RDVEN are enabled to high level in power-up. All PMOS and NMOS transistors 302~316 of a data input signal 300 are turned on by low-to-high transition of a control signal DINEN and high-to-low transition of a control signal DINENB. Consequently, output signal lines PF1~PF4 of the detection circuit 100 are charged to high level, respectively. And, other lines PF5~PF8 are charged to low level, respectively. By low-to-high transition of the control signals VDMP_DEN and RDYEN, a dumping voltage supply circuit 200 generates dumping voltages VDMP1_1~VDMP1_4 and VDMP0_1~VDMP0_4 whose voltage levels are different from each other. A decoder circuit 400 is enabled by a control signal DEC_EN which retains low level.

Under such a condition, first and second dummy bitlines DBL1~DBL8 and DBL1B~DBL8B are precharged to a ground voltage Vss via corresponding NMOS transistors 122 turned on a precharge signal DBLP of high level, respectively. After high-to-low transition of the precharge signal DBLP, a dummy word line signal DWL transitions from low level to high level, turning on an access transistor 112 of each dummy cell 110.

As a switch control signal DMPRS is enabled to high level, the dumping voltages VDMP1_1~VDMP1_4 and VDMP0_1~VDMP0_4 are transmitted to corresponding second dummy bitlines DBL1B~DBL8B, respectively. As a dummy plate line signal DPL is enabled with a pulse shape, a voltage is applied from the dummy plate line DPL to a first dummy bitline at both terminals of a ferroelectric capacitor in each dummy cell. That is, a negative voltage is applied to both the terminals of the ferroelectric capacitor. As a dummy plate line signal is disabled with time predetermined time, the applied voltage to both the terminals is removed. Consequently, a ferroelectric capacitor of each dummy cell has a polarization state of point "A" shown in FIG. 2.

Under such a condition, as a switch control signal DYSW is enabled to high level, each of the first dummy bitlines DBL1~DBL4 is driven (or charged) by power supply voltage Vcc supplied via PMOS transistors 302~308 of the data input circuit 300. The others DBL5~DBL8 are grounded via the NMOS transistors 310~316 of he data input circuit 300. Since a positive voltage is applied to both terminals of a ferroelectric capacitor 114 in dummy cells coupled to first dummy bitlines DBL1~DBL4 having a power supply voltage Vcc, polarization states of the ferroelectric capacitor 114 are changed from point "A" to point "C". That is, data "1" is written in the dummy cells 110 coupled to the dummy bitlines DBL1~DBL4.

In the other respect, ideally, since there is no a voltage difference between both terminals of a ferroelectric capacitor 114 in dummy cells 110 coupled to the grounded first dummy bitlines DBL5~DBL8, the ferroelectric capacitor 114 continuously retains a state of point "A". That is, data "0" is written in the dummy cells 110 coupled to the first dummy bitlines DBL5~DBL8. After the dummy plate line signal DPL is then enabled to a pulse shape again, the switch control signal DYSW and the dummy word line signal DWL are sequentially disabled. Through a series of these steps, write operation of a polarization state detection circuit is completed. The control signals DINEN and DINENB are then disabled to low level and high level, respectively. As a result, the data input circuit 300 is electrically isolated from the polarization state detection circuit 100.

In order to generate a reference voltage VREF according to a polarization state of a ferroelectric capacitor 114 which is supplied to dummy cells 110, respectively, write operation carried out in power-up is completed to check a polarization state of each of the ferroelectric capacitor 114. This will be described more fully hereinafter with reference to FIG. 12.

A first and second dummy bitlines DBL1~DBL8 and DBL1B~DBL8B are precharged to a ground voltage Vss via corresponding NMOS transistors 122 turned on by a precharge signal DBLP of high level, respectively. After high-to-low transition of the precharge signal DBLP, a dummy word line signal DWL transitions from low level to high level, simultaneously turning on access transistors 112 of dummy cells 110.

As a switch control signal DMPRS is then enabled to high level, dumping voltages VDMP1_1~VDMP1_4 and VDNMP0_1~VDNMP0_4 from the dumping voltage supply circuit 200 are transferred to corresponding second dummy bitlines DBL1B~DBL8B via NMOS transistors 116. As a dummy plate line signal DPL is enabled with a pulse shape, a voltage is applied from a dummy plate line DPL to a corresponding first dummy bitline at both terminals of a ferroelectric capacitor in each dummy cell 10. That is, a negative voltage is applied to both the terminals. As the dummy plate line signal is enabled with time, the applied voltage to both the terminals is removed. Therefore, polarization states of ferroelectric capacitors in dummy cells coupled to dummy bitlines DBL1~DBL4 storing data"1" are switched from point"C" to point"A" (see FIG. 2). On the other hand, polarization states of ferroelectric capacitors in dummy cells coupled to dummy bitlines DBL5~DBL8 storing data e"0" are cycled from point"A" to point"D" and back to point"A" (see FIG. 2). Voltages of the first dummy bitlines DBL1~DBL8 induced by ferroelectric capacitors having the switched polarization states will be amplified to a power supply voltage of high level or a ground voltage of low level by sense amplifiers 118, as a result of voltage comparison with dumping voltages. The set logic states of the first dummy bitlines DBL1~DBL8 are outputted to the decoder circuit 400 as pass/fail signals PF1~PF8 when a switch control signal DYSW is enabled. Determining the logic states of the pass/fail signals PF1~PF8 will be described more fully as follows.

Figure 13:
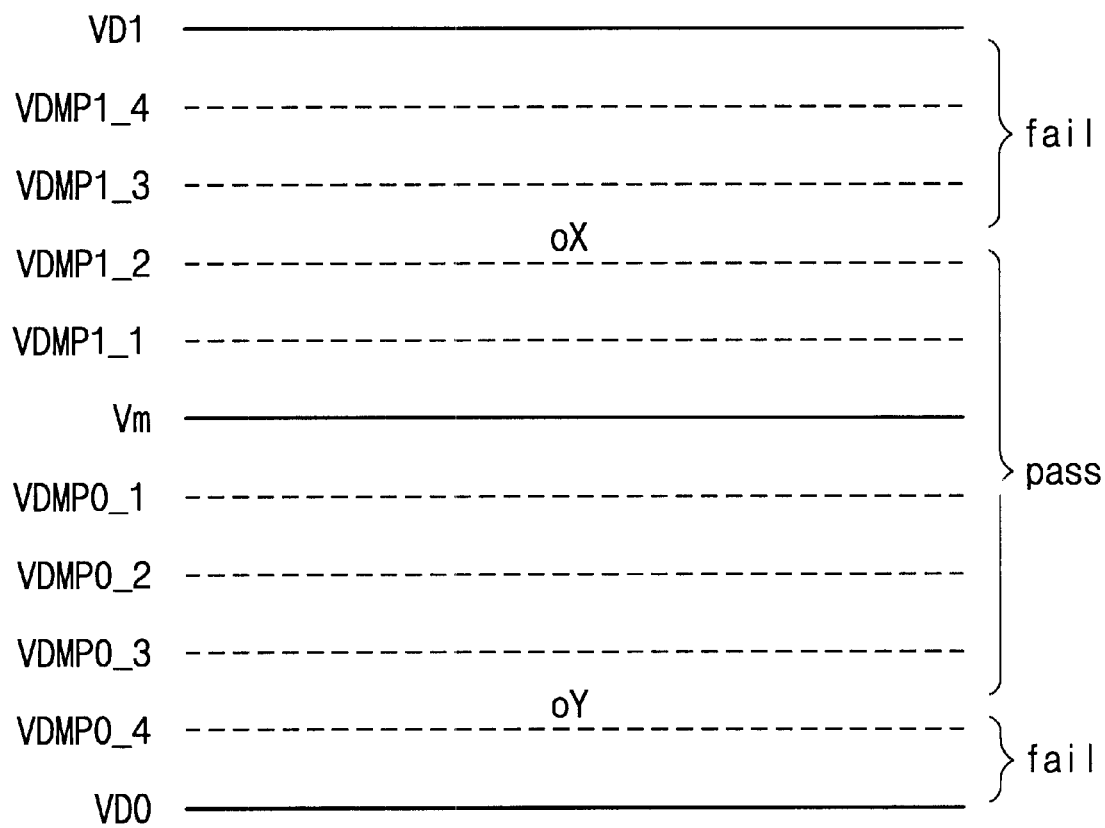
FIG. 13 illustrates relationship between bitline induction voltages corresponding to data"1" and data"0" and dumping voltages.
Figure 14:
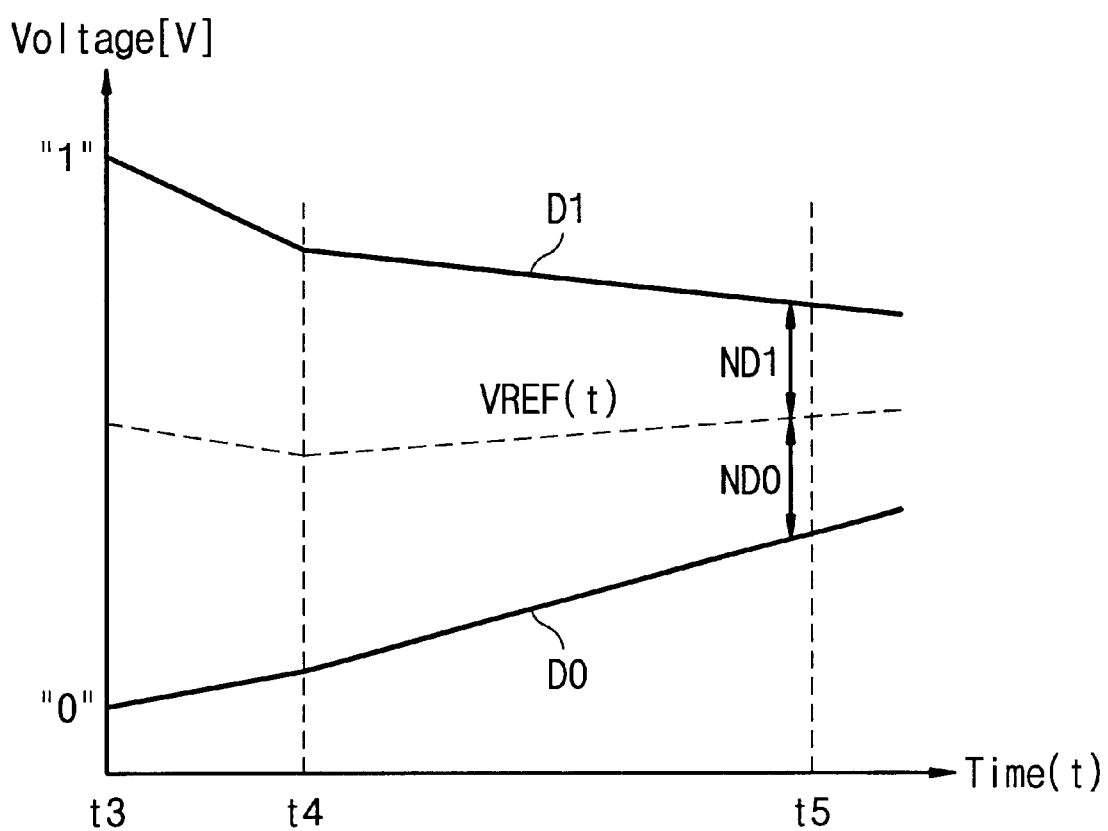
FIG. 14 is a graph showing how the reference voltage of the invention adjusts with the age of the memory, to maintain optimum performance.

Referring now to FIG. 13, dumping voltages VDMP1_1~VDMP1_4 and VDMP0_1 VDMP0_4 supplied to the polarization state detection circuit 100 are connected between a bitline induction voltage VD1 corresponding to data"1" and a bitline induction voltage VD0 corresponding to data"0". The dumping voltages VDMP1_1~VDMP1_4 are connected between an intermediate value Vm of the voltages VD1 and VD0 and the voltage VD1. The dumping voltages VDMP0_1~VDMP0_4 are connected between the voltages Vm and VD0. Dumping voltages having such a voltage distribution and dummy cells 110 storing data"0" and data"1" half-and-half are used to check a polarization state of a ferroelectric capacitor that is changed with time.

For example, when a first dummy bitline voltage VD1 induced by a dummy cell having data"1" is higher than a corresponding dumping voltage in a logic level, the first dummy bitline voltage is amplified to a power supply voltage Vcc indicating data"1" by a corresponding sense amplifier. When the induced voltage VD1 is lower than the corresponding dumping voltage in logic level, the first dummy bitline voltage becomes a ground voltage Vss indicating data"0" by the corresponding sense amplifier. Similarly, when a first dummy bitline voltage VD0 induced by a dummy cell storing data"0" is lower than a corresponding dumping voltage in logic level, the first dummy bitline voltage becomes a ground voltage Vss indicating data"0" by a corresponding sense amplifier. When the induced voltage VD0 is higher than the corresponding dumping voltage in logic level, the first dummy bitline voltage is amplified to a power supply voltage Vcc indicating data"1" by the corresponding sense amplifier.

Before the hysteresis curve is changed, logic states on first dummy bitlines DBL1~DBL4 connected to dummy cells storing data"1" have logic high level (i.e., power supply voltage level) by corresponding sense amplifiers 118. And, logic states on first dummy bitlines DBL5~DBL8 connected to dummy cells storing data"0" have logic low level (i.e., ground voltage level) by corresponding sense amplifiers 118. This means that a pass/fail signal goes to high level (logic"1") when data"1" is read out with an originally written state, and the pass/fail signal goes to low level (logic"0") when data"0" is read out with an originally written state.

Figure 1:
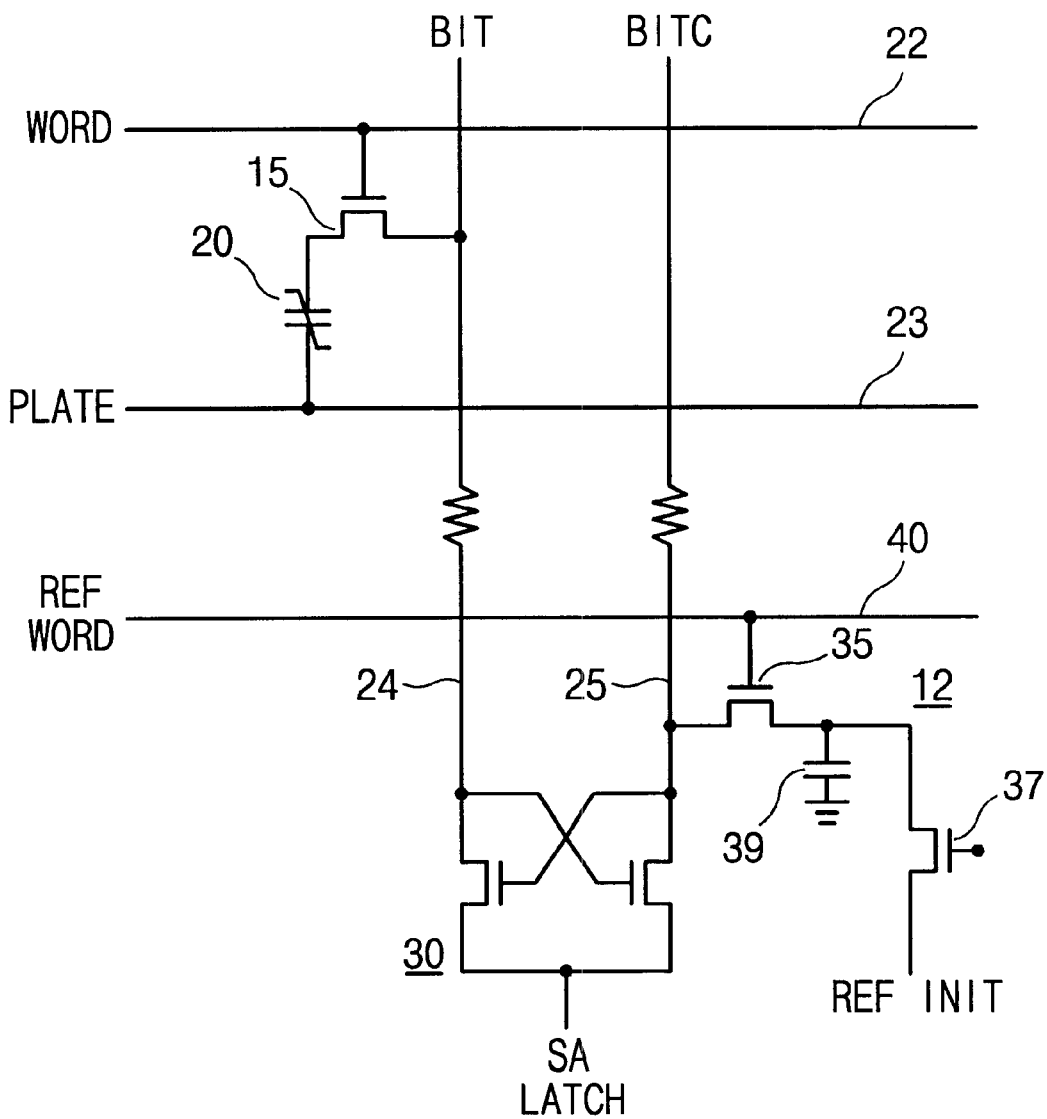
FIG. 1 is a circuit diagram showing a conventional ferroelectric random access memory device.
Figure 2A:
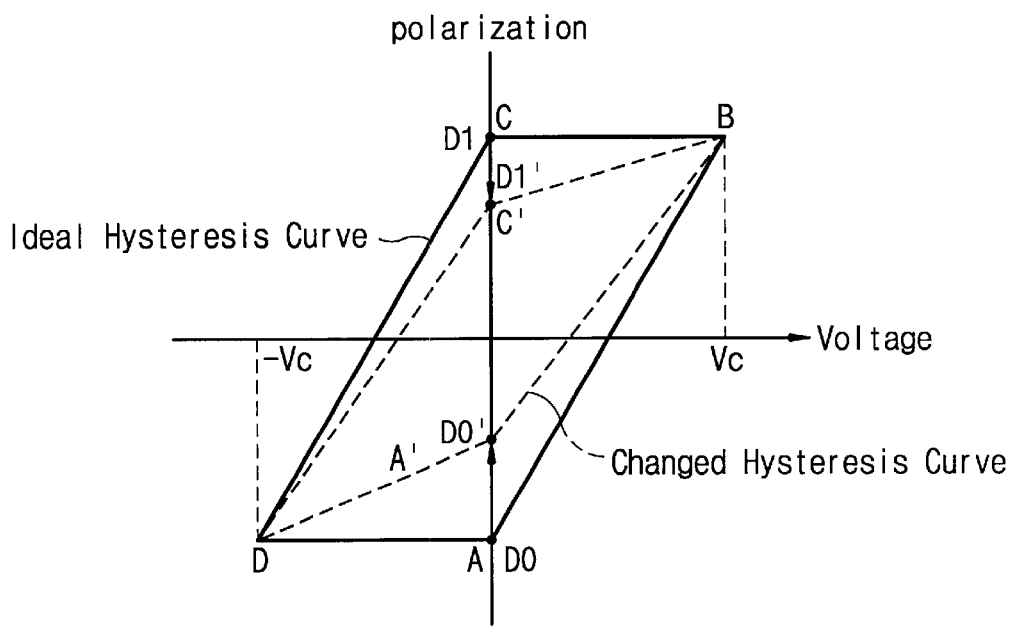
FIG. 2A is a graph showing an ideal hysteresis characteristic and a deteriorated hysteresis characteristic.
Figure 2B:
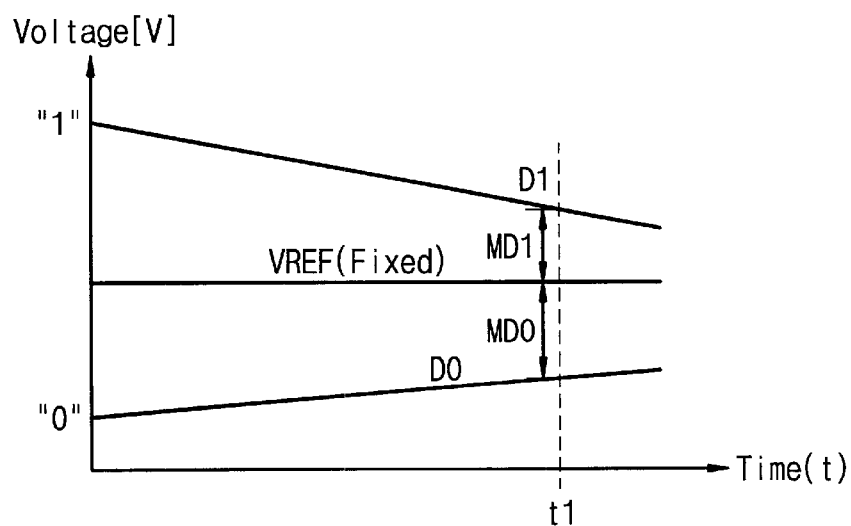
FIG. 2B is a graph showing changes of voltages and times corresponding to a state of data stored in a ferroelectric memory cell.

If a hysteresis curve of a ferroelectric capacitor collapses with time as shown by a dotted line of FIG. 2A, a bitline voltage VD1 induced by a dummy cell storing data"1" goes low and a bitline voltage VD0 induced by a dummy cell storing data"0" goes high. Thus, first dummy bitlines (e.g., DPL4 and DPL3) associated with dumping voltages (e.g., VDMP1_4 and VDMP1_3 shown in FIG. 6) which is higher than the voltage VD1 going high (e.g., point X shown in FIG. 6) have a ground voltage indicating data"0" by corresponding sense amplifier, respectively. The other first dummy bitlines (e.g., DBL1 and DBL2) have a power supply voltage indicating originally written data"1", respectively.

Thus, while read operation to dummy cells connected to first dummy bitlines DBL1 and DBL2 is normally performed, read operation to dummy cells connected to first dummy bitlines DBL3 and DBL4 is abnormally performed (read-out fail occurs). Therefore, pass/fail signals PF1 and PF2 corresponding to the first dummy bitlines DBL1 and DBL2 go to high level, and pass/fail signals PF3 and PF4 corresponding to the first dummy bitlines DBL3 and DBL4 goes to low level.

Similarly, a first dummy bitline (e.g., DBL8) associated with dumping voltages (e.g., VDMP0_4 and VDMP1_3) which is lower than the voltage VD0 going high (e.g., point Y shown in FIG. 6) has a power supply voltage indicating data"1" by a corresponding sense amplifier. The other first dummy bitlines (e.g., DBL5, DBL6, and DBL7) has a ground voltage indicating originally written data"0", respectively. Thus, pass/fail signals PF5, PF6, and PF7 corresponding to first dummy bitlines DBL5, DBL6, and DBL7 go to low level, and a pass/fail signal corresponding to a first dummy bitline DBL8 goes to high level.

The pass/fail signals PF1~PF8 are decoded by a decoder circuit 400, and then selection signals SEL1~SEL6 based on the decoding result are stored in a latch circuit 500. Thereafter, the reference voltage generator 600 internally generates distribution voltage whose voltage levels are different from each other. One of the generated distribution voltages is outputted as an optimal reference voltage VREF according to change in a polarization state of a ferroelectric capacitor. If all pass/fail signals PF1~PF8 outputted from the polarization state detection circuit 100 have pass or fail states, or have abnormal logic values, a default value will be outputted as a reference voltage VREF.

Not only read operation for generating the selection signals S1~S8 but also operation for writing data"1" and data"0" are carried out only in power-up. Since the generated selection signals SEL1~SEL6 are then stored in a latch circuit 500, a reference voltage VREF will automatically be generated without read operation according to the signals SEL1~SEL6 stored in the latch circuit 500. It is understood that a reference circuit 1000 of this invention can be applied to both an open bitline structure and a folded bitline structure.

As mentioned so far, a polarization state of a ferroelectric capacitor, which is changed with time, can be checked by logic states of pass/fail signals. Thus, although a polarization state of a ferroelectric capacitor in a memory cell is changed with time, a reference circuit of an FRAM device of this invention can generate a reference voltage having an intermediate value of bitline voltages which correspond to data states, respectively.

What is claimed is:

1. A ferroelectric random access memory device comprising:
a memory cell array including a plurality of memory cells where rows and columns are arranged with a matrix shape, wherein each of the memory cells has a ferroelectric capacitor and an access transistor;
a sense amplifier circuit for sensing a data state of each of the memory cells using a reference voltage; and
a reference circuit for supplying the reference voltage to the sense amplifier circuit,
wherein the reference circuit includes:
a dumping voltage supply circuit for generating dumping voltages when power is supplied, wherein voltage levels of the dumping voltages are different from each other;
a polarization state detection circuit including plural dummy cells, each of which has a ferroelectric capacitor and an access transistor, for checking a polarization state of each of the ferroelectric capacitors in response to the dumping voltages corresponding to the dummy cells, respectively, the polarization state detection circuit for further outputting pass/fail signals corresponding to the dummy cells, respectively, as a checking result, each of the pass/fail signals indicating whether a voltage corresponding to a polarization state of the ferroelectric capacitor is higher or lower than a dumping voltage;
a decoder circuit for decoding the outputted pass/fail signals from the polarization state detection circuit to generate selection signals; and
a reference voltage generator for internally generating distribution voltages corresponding to the selection signals, respectively, and outputting one of the distribution voltages as the reference voltage in response to the selection signals, wherein voltage levels of the distribution voltages are different from each other.

2. The device of claim 1 further comprising:
a latch circuit connected between the decoder circuit and the reference voltage generator, for holding the selection signals.

3. The device of claim 1, wherein the plural dummy cells are classified into
a first group of dummy cells for storing data of a first logic state and
a second group of dummy cells for storing data of a second logic state.

4. The device of claim 3, wherein the polarization state detection circuit includes:
a plurality of first dummy bitlines connected to the dummy cells, respectively;
a plurality of second dummy bitlines corresponding to the first dummy bitlines, respectively
a plurality of first switch transistors for connecting the first dummy bitlines to the decoder in response to a first switch control signal so as to output logic states on the first dummy bitlines as the pass/fail signals;
a plurality of capacitors corresponding to the dumping voltages, respectively, wherein each of the capacitors has a first plate electrode connected to a corresponding dumping voltage and a second plate electrode connected to a corresponding second dummy bitline through a second switch transistor, wherein the second switch transistors corresponding to the capacitors, respectively, operate in response to a second switch control signal; and
a plurality of sense amplifiers coupled between the first and second dummy bitlines, respectively, wherein each of the sense amplifiers senses a voltage difference between corresponding first and second bitlines, and then amplifies the corresponding first dummy bitline with either a first logic state or a second logic state depending upon the sensing result,
wherein logic states of the pass/fail signals are determined by means of logic states of the first dummy bitlines which are sensed and amplified by a corresponding sense amplifier, respectively.

5. The device of claim 4, wherein the dumping voltages are connected between voltages corresponding to the data of the first logic state and the data of the second logic state.

6. The device of claim 4, wherein the polarization state detection circuit further includes
a bitline precharge circuit for charging the first and second dummy bitlines to a ground voltage.

7. The device of claim 5, wherein the reference circuit further includes
a data input circuit connected to the first dummy bitlines, for transferring a power supply voltage to the first dummy bitlines corresponding to the dummy cells of the first group, respectively, and for transferring a ground voltage to the first dummy bitlines corresponding to the dummy cells of the second group, respectively, in response to a data input signal enabled when the power is applied.

8. A ferroelectric random access memory device comprising:
a memory cell array including a plurality of memory cells where rows and columns are arranged with a matrix shape, wherein each of the memory cells has a ferroelectric capacitor and an access transistor;
a sense amplifier circuit for sensing a data state of each of the memory cells using a reference voltage; and
a reference circuit for supplying the reference voltage to the sense amplifier circuit,
wherein the reference circuit includes:
a dumping voltage supply circuit for generating dumping voltages when power is supplied, wherein voltage levels of the dumping voltages are different from each other;

a polarization state detection circuit having a plurality of dummy cells each of which has a ferroelectric capacitor and an access transistor, for checking a polarization state of each of the ferroelectric capacitors in response to the dumping voltages corresponding to the dummy cells, respectively, the polarization state detection circuit for further outputting pass/fail signals corresponding to the dummy cells, respectively, as a check result, each of the pass/fail signals indicating whether a voltage corresponding to a polarization state of the ferroelectric capacitor is higher or lower than a dumping voltage;

a decoder circuit for decoding the outputted pass/fail signals from the polarization state detection circuit decode the pass/fail signals to generate selection signals;

a reference voltage generator for internally generating distribution voltages corresponding to the selection signals, respectively, when the power is supplied, and outputting one of the distribution voltages as the reference voltage when one of the selection signals is enabled, wherein voltage levels of the selection signals are different from each other; and a control circuit for generating a control signal when the power is applied, the control circuit disabling the control signal when one of the selection signals is enabled and continuously enabling the control signal when all the selection signals are continuously disabled, wherein the reference voltage generator outputs a default value as the reference voltage in response to the generated control signal when the all the selection signals are continuously disabled.

9. The device as claimed in claim 8, wherein the default value is one of the distribution voltages and the distribution voltage outputted as the reference voltage is higher or lower than the default value.

10. The device as claimed in claim 9, wherein an output terminal of the reference voltage generator is precharged to the default value by the control signal.

11. The device as claimed in claim 8, wherein the decoder circuit disables all the selection signals when all the pass/fail signals have a pass logic state or have a fail logic state or have an abnormal logic state.

12. The device as claimed in claim 8 further comprising a latch circuit, connected between the decoder circuit and the reference voltage generator, for holding the selection signals.

13. The device as claimed in claim 12, wherein the plural dummy cells is classified into a first group of dummy cells and a second group of dummy cells, wherein the dummy cells of the first group store data of a first logic state and the dummy cells of the second group store data of a second logic state.

14. The device as claimed in claim 13, wherein the polarization state detection circuit includes:

a plurality of first dummy bitlines coupled to the dummy cells, respectively;

a plurality of second dummy bitlines corresponding to the first dummy bitlines, respectively;

a plurality of first switch transistors connecting the first dummy bitlines to the decoder circuit in response to a first switch control signal such that logic states of the first dummy bitlines are outputted as the pass/fail signals;

a plurality of capacitors, corresponding to the dumping voltages, respectively, having a first plate electrode coupled to each of the corresponding dumping voltages and a second plate electrode connected to a second dummy bitline via a second switch transistor, wherein the corresponding second switch transistors are operated in response to a second switch control signal; and a plurality of sense amplifiers, coupled between the first and second dummy bitlines, respectively, each of which senses a voltage difference between the first and second dummy bitlines, and then amplifies a corresponding first dummy bitline to one of the first and second logic states as a sensing result, wherein logic states of pass/fail signals are determined by logic states of the first dummy bitlines sensed and amplified by the sense amplifiers.

15. The device as claimed in claim 14, wherein the dumping voltages are connected between a voltage corresponding to the data of the first logic state and a voltage corresponding to the data of the second logic state.

16. The device as claimed in claim 15, wherein the polarization state detection circuit further includes a bitline precharge circuit for charging the first and second dummy bitlines to a ground voltage.

17. The device as claimed in claim 15, wherein the reference circuit further includes a data input circuit connected to the first dummy bitlines which transfer a power supply voltage to first dummy bitlines corresponding to the dummy cells of the first group in response to a data input signal enabled when the power is applied, respectively, and transfer a ground voltage to first dummy bitlines corresponding to the dummy cells of the second group, respectively.

* * * * *

UNITED STATES PATENT AND TRADEMARK OFFICE
CERTIFICATE OF CORRECTION

PATENT NO. : 6,392,916 B1
DATED : May 21, 2002
INVENTOR(S) : Choi et al.

It is certified that error appears in the above-identified patent and that said Letters Patent is hereby corrected as shown below:

Column 1,
Line 17, "as "FRAM" uses" should read -- as "FRAM") uses --.
Line 27, ""coercive voltage"" should read -- "coercive voltage." --.
Line 30, "flows, If" should read -- flows. If --.
Line 65, "state Of" should read -- state of --.

Column 2,
Line 11, "plate" should read -- PLATE --.
Line 53, "signal," should read -- signal. --.

Column 3,
Line 1, "point 'C'" should read -- point C' --.
Line 1, "point 'A'" should read -- point A' --.
Lines 7, 8 and 13, "date" should read -- data --.
Line 16, "greater the" should read -- greater than --.
Line 37, "due the" should read -- due to the --.
Line 55, "and the" should read -- and of the --.

Column 5,
Line 3, "to corresponding to" should read -- to corresponding --.

Column 6,
Lines 5 and 11, "When is lower" should read -- When it is lower --.
Line 16, "When are" should read -- When they are --.
Line 32, "VDMP0A" should read -- VDMP0_A --.
Line 62, "fully in later." should read -- fully later. --.

Column 7,
Line 33, "fully in later." should read -- fully later. --.
Line 52, "SEL1~EL6" should read -- SEL1~SEL6 --.

Column 8,
Line 21, "RDYEN" should read -- RDVEN --.
Line 44, "time predetermined time" should read -- predetermined time --.
Line 53, "of he data" should read -- of the data --.
Line 61, "no a voltage" should read -- no voltage --.
Line 67, "fully in later." should read -- fully later. --.

UNITED STATES PATENT AND TRADEMARK OFFICE
CERTIFICATE OF CORRECTION

PATENT NO.    : 6,392,916 B1
DATED         : May 21, 2002
INVENTOR(S)   : Choi et al.

It is certified that error appears in the above-identified patent and that said Letters Patent is hereby corrected as shown below:

<u>Column 9,</u>
Line 25, "VDNMP0_1" should read -- VDMP0_1 --.
Line 40, "data e "o"" should read -- data "o" --.
Line 49, "VDMP0_1 VDMP0_4" should read -- VDMP0_1~VDMP0_4 --.

<u>Column 12,</u>
Line 12, "respectively" should read -- respectively; --.

<u>Column 13,</u>
Line 32, "the all the" should read -- all the --.

Signed and Sealed this

Twenty-ninth Day of October, 2002

Attest:

*Attesting Officer*

JAMES E. ROGAN
*Director of the United States Patent and Trademark Office*